United States Patent
Ho et al.

(10) Patent No.: US 8,921,703 B2
(45) Date of Patent: Dec. 30, 2014

(54) CIRCUIT BOARD, STRUCTURAL UNIT THEREOF AND MANUFACTURING METHOD THEREOF

(71) Applicant: HTC Corporation, Taoyuan County (TW)

(72) Inventors: Chin-Wei Ho, Taoyuan County (TW); Hui-Ling Tsai, Taoyuan County (TW)

(73) Assignee: HTC Corporation, Taoyuan County (TW)

( * ) Notice: Subject to any disclaimer, the term of this patent is extended or adjusted under 35 U.S.C. 154(b) by 172 days.

(21) Appl. No.: 13/757,853

(22) Filed: Feb. 4, 2013

(65) Prior Publication Data
US 2013/0213693 A1    Aug. 22, 2013

Related U.S. Application Data

(60) Provisional application No. 61/599,954, filed on Feb. 17, 2012.

(51) Int. Cl.
| | |
|---|---|
| *H05K 1/03* | (2006.01) |
| *H05K 1/02* | (2006.01) |
| *H05K 1/09* | (2006.01) |
| *H05K 1/14* | (2006.01) |
| *B29C 65/00* | (2006.01) |
| *H05K 3/00* | (2006.01) |
| *H01L 21/48* | (2006.01) |

(52) U.S. Cl.
CPC .. *H05K 3/00* (2013.01); *H05K 1/02* (2013.01); *H01L 21/4857* (2013.01)

USPC .......... 174/255; 174/257; 174/259; 361/790; 156/60

(58) Field of Classification Search
USPC .......... 174/255, 256, 257, 259; 361/784, 790, 361/792; 156/60
See application file for complete search history.

(56) References Cited

U.S. PATENT DOCUMENTS

| | | | | |
|---|---|---|---|---|
| 6,335,076 | B1 * | 1/2002 | Nakamura et al. | 428/131 |
| 6,534,723 | B1 * | 3/2003 | Asai et al. | 174/255 |
| 6,748,652 | B2 * | 6/2004 | Andou et al. | 29/852 |
| 2005/0016768 | A1 * | 1/2005 | Zollo et al. | 174/262 |
| 2008/0210460 | A1 * | 9/2008 | Lien et al. | 174/260 |
| 2010/0038125 | A1 * | 2/2010 | Kumar et al. | 174/262 |
| 2011/0189432 | A1 * | 8/2011 | Goto et al. | 428/141 |
| 2011/0214906 | A1 * | 9/2011 | Baars et al. | 174/257 |
| 2011/0289774 | A1 * | 12/2011 | Kumar et al. | 29/852 |

FOREIGN PATENT DOCUMENTS

| | | |
|---|---|---|
| TW | 200810657 | 2/2008 |
| TW | 200826774 | 6/2008 |
| TW | 200847885 | 12/2008 |

OTHER PUBLICATIONS

"Office Action of Taiwan Counterpart Application", issued on Sep. 23, 2014, pp. 1-16.

* cited by examiner

*Primary Examiner* — Hoa C Nguyen
(74) *Attorney, Agent, or Firm* — Jianq Chyun IP Office

(57) ABSTRACT

A circuit board, structural units and a manufacturing method are provided, wherein one or more high temperature lamination processes are conducted for laminating the structural units and form a multi-layered circuit board.

20 Claims, 13 Drawing Sheets

CIRCUIT BOARD, STRUCTURAL UNIT THEREOF AND MANUFACTURING METHOD THEREOF

CROSS-REFERENCE TO RELATED APPLICATION

This application claims the priority benefit of U.S. provisional application Ser. No. 61/599,954, filed on Feb. 17, 2012. The entirety of the above-mentioned patent application is hereby incorporated by reference herein and made a part of this specification.

FIELD OF THE INVENTION

The present application relates to a circuit board, structural unit thereof and a method for manufacturing the same. In particular, the present application relates to the circuit board, the structural units and the manufacturing method thereof, which adopts one or more high temperature lamination processes for forming the same.

One of manufacturing methods of a conventional flexible circuit board comprises performing pre-treatment and sputtering on one surface or two opposite surfaces of an insulation substrate to form circuit layers. However, the steps of above process are complicated and the cost of sputtering is high. The existing flexible circuit boards are generally composed of flexible copper clad laminates (FCCL), insulation substrates, and adhesive. The manufacturing method of such type of flexible circuit board includes patterning an FCCL by etching to form circuits. Then, the FCCL and an insulation substrate are bonded through adhesive by conducting a fast press step.

It is noted that, in manufacturing the above flexible circuit, high temperature and long time press is not available due to an inferior heat endurance of the layers of the flexible circuit. Thus, the existing flexible circuit board is mostly single layered or double layered. A flexible circuit board with a more-layered circuit structure is not preferred. In addition, the adhesive of the flexible circuit has high dielectric constant, and is unfavorable to circuits with high resolution and integration.

A conventional printed circuit board may provide a multi-layered circuit structure, but the FR4 substrate comprising glass fabric still has high dielectric constant. On the other hand, glass fabric with short fiber may be used to reduce thickness of the printed circuit board, but the glass fabric with short fiber cost high.

SUMMARY OF THE INVENTION

The present application provides a circuit board process which accomplishes rapid and highly reliable manufacture of multi-layered circuit board by conducting one or more high temperature lamination processes.

The circuit board process includes following steps.

First, a core unit and a first lamination unit are provided. The core unit includes a first polyimide layer, a first adhesive layer, a second adhesive layer, a first conductive layer and a second conductive layer. The first adhesive layer and the second adhesive layer are respectively disposed on a first surface and a second surface of the first polyimide layer. The first conductive layer and the second conductive layer are respectively disposed on the first adhesive layer and the second adhesive layer. The first lamination unit includes a second polyimide layer, a third adhesive layer, a fourth adhesive layer and a third conductive layer. The third adhesive layer and the fourth adhesive layer are respectively disposed on a third surface and a fourth surface of the second polyimide layer. The fourth adhesive layer is exposed and facing the first conductive layer. The third conductive layer is disposed on the third adhesive layer. Then, a first lamination step is performed with a temperature higher than 160° C. to laminate the first lamination unit and the core unit and to bond the fourth adhesive layer to the first conductive layer.

The present application provides a circuit board which has high endurance to processing temperature to be compatible with the present processing equipment of printed circuit board, and the circuit board has small thickness.

The circuit board includes a core unit and a first lamination unit. The core unit includes a first polyimide layer, a first adhesive layer, a second adhesive layer, a first conductive layer and a second conductive layer. The first adhesive layer and the second adhesive layer are respectively disposed on a first surface and a second surface of the first polyimide layer. The first conductive layer and the second conductive layer are respectively disposed on the first adhesive layer and the second adhesive layer. The first lamination unit includes a second polyimide layer, a third adhesive layer, a fourth adhesive layer and a third conductive layer. The second polyimide layer has a third surface and a fourth surface opposite to each other. The third adhesive layer and the fourth adhesive layer are respectively disposed on the third surface and the fourth surface of the second polyimide layer. The fourth adhesive layer is bonded to the first conductive layer. The third conductive layer is disposed on the third adhesive layer. A glass transition temperature of the first adhesive layer, the second adhesive layer, the third adhesive layer and the fourth adhesive layer is between about 140° C. and 160° C.

The present application further provides a flexible-rigid composite circuit board which has favorable flexibility and high endurance to processing temperature to be compatible with the present processing equipment of printed circuit board. In addition, the flexible-rigid composite circuit board of the present application has a thickness less than a conventional flexible-rigid composite circuit board.

The circuit board includes a first core unit, a second core unit, a third core unit, a seventh adhesive layer, an eighth adhesive layer, a first lamination unit and a second lamination unit. The first core unit includes a first polyimide layer, a first adhesive layer, a second adhesive layer, a first conductive layer and a second conductive layer. The first adhesive layer and the second adhesive layer are respectively disposed on a first surface and a second surface of the first polyimide layer. The first conductive layer and the second conductive layer are respectively disposed on the first adhesive layer and the second adhesive layer.

The second core unit is disposed at a first side of the first core unit. The second core unit includes a second polyimide layer, a third adhesive layer, a fourth adhesive layer, a third conductive layer and a fourth conductive layer. The third adhesive layer and the fourth adhesive layer are respectively disposed on a third surface and a fourth surface of the second polyimide layer. The third conductive layer and the fourth conductive layer are respectively disposed on the third adhesive layer and the fourth adhesive layer, and the fourth conductive layer faces the first conductive layer.

The third core unit is disposed at a second side of the first core unit. The third core unit includes a third polyimide layer, a fifth adhesive layer, a sixth adhesive layer, a fifth conductive layer and a sixth conductive layer. The fifth adhesive layer and the sixth adhesive layer are respectively disposed on a fifth surface and a sixth surface of the third polyimide layer. The fifth conductive layer and the sixth conductive layer are respectively disposed on the fifth adhesive layer and the sixth adhesive layer, and the sixth conductive layer faces the second conductive layer.

The seventh adhesive layer is disposed between the first core unit and the second core unit, and the fourth conductive layer is bonded to the first conductive layer through the seventh adhesive layer. The eighth adhesive layer is disposed between the first core unit and the third core unit, and the sixth conductive layer is bonded to the second conductive layer through the eighth adhesive layer.

The first lamination unit is located at the first side of the first core unit and includes a fourth polyimide layer, a ninth adhesive layer, a tenth adhesive layer and a seventh conductive layer. The ninth adhesive layer and the tenth adhesive layer are respectively disposed on a seventh surface and an eighth surface of the fourth polyimide layer. The tenth adhesive layer is bonded to the third conductive layer, and the seventh conductive layer is disposed on the ninth adhesive layer.

The second lamination unit is located at the second side of the first core unit and includes a fifth polyimide layer, an eleventh adhesive layer, a twelfth adhesive layer and an eighth conductive layer. The eleventh adhesive layer and the twelfth adhesive layer are respectively disposed on a ninth surface and a tenth surface of the fifth polyimide layer. The twelfth adhesive layer is bonded to the fifth conductive layer of the third core unit, and the eighth conductive layer is disposed on the eleventh adhesive layer.

In order to make the aforementioned and other features and advantages of the present application more comprehensible, several embodiments accompanied with figures are described in detail below.

DESCRIPTION OF EMBODIMENTS

The present application is subjected to a single layered circuit board, a multi-layered circuit board, a flexible-rigid composite circuit board, and structural units and process for manufacturing the aforementioned various types of circuit boards. The subject matter for forming various types of circuit boards of the present application are illustrated below, in starting at structural units and accompanied with plural embodiments.

Figure 1A:
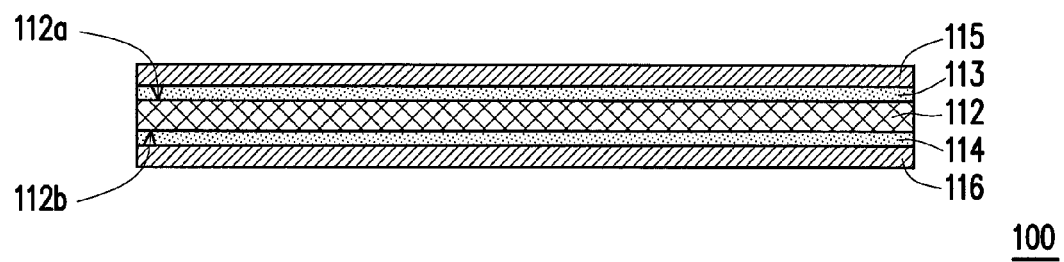
FIGS. 1A through 1C illustrate multiple types of structural units according to an embodiment of the present application.
Figure 1B:
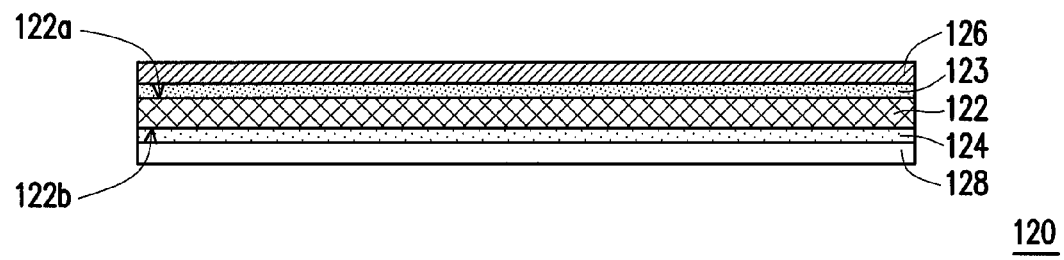
Figure 1C:
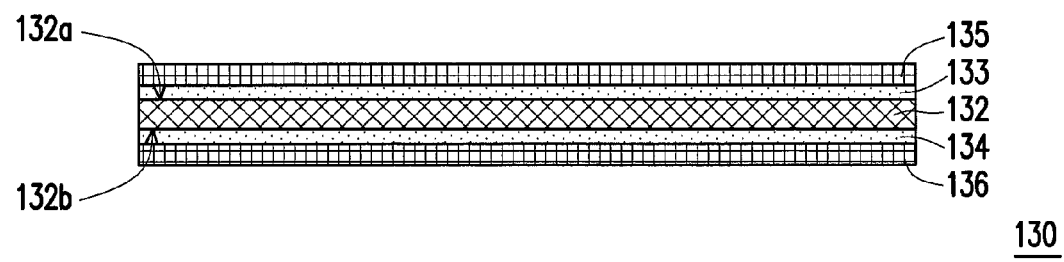

FIGS. 1A through 1C illustrate multiple types of structural units according to an embodiment of the present application. For convenience of illustrating the following manufacturing process, the structural units as shown in FIGS. 1A through 1C are respectively referred to a core unit, a lamination unit and a bonding unit.

The core unit 110 as shown in FIG. 1 includes a polyimide layer 112, a first adhesive layer 113, a second adhesive layer 114, a first conductive layer 115 and a second conductive layer 116. The first adhesive layer 113 and the second adhesive layer 114 are respectively disposed on a first surface 112a and a second surface 112b of the polyimide layer 112. The first conductive layer 115 is disposed on the first adhesive layer 113. The second conductive layer 116 is disposed on the second adhesive layer 114.

In addition, the lamination unit 120 as shown in FIG. 1B includes a polyimide layer 122, a first adhesive layer 123, a second adhesive layer 124, a conductive layer 126 and a releasing layer 128. The polyimide layer 122 has a first surface 122a and a second surface 122b. The first adhesive layer 123 and the second adhesive layer 124 are respectively disposed on a first surface 122a and a second surface 122b of the polyimide layer 122. The conductive layer 126 is disposed on the first adhesive layer 123. The releasing layer 128 is disposed on the second adhesive layer 124.

Furthermore, as shown in FIG. 1C, the bonding unit 130 includes a polyimide layer 132, a first adhesive layer 133, a second adhesive layer 134, a first base layer 135 and a second base layer 136. The first adhesive layer 133 and the second adhesive layer 134 are respectively disposed on a first surface 132a and a second surface 132b of the polyimide layer 132. The first base layer 135 is disposed on the first adhesive layer 133. The second base layer 136 is disposed on the second adhesive layer 134.

The aforementioned first adhesive layers 113, 123, 133 and the aforementioned second adhesive layers 114, 124, 134 are for example made of the same material, which has a dielectric constant less than 3, such as between 2.6 and 2.8. Here, the dielectric constant is obtained under 1 GHz according to IPC TM650-2.5.5.9. In addition, to be compatible with following high temperature lamination steps, a glass transition temperature of the first adhesive layers 113, 123, 133 and the second adhesive layers 114, 124, 134 is for example between 140° C. and 160° C. Persons of ordinary skill in the art should know that the "glass transition temperature" (Tg) should be a kind of transition temperatures. Polymers, such as the first adhesive layers 113, 123, 133 and the second adhesive layers 114, 124, 134, being in the glass transition temperature, can be transformed from a rubbery state to a glass state. For instance, the crystalline polymer has distinct glass transition temperature and latent heat value, and whether the polymer is in the glass state or the rubbery state depends on the glass transition temperature of the polymer and the temperature in using. In other words, the adhesive layers with a glass transition temperature between 140° C. and 160° C., can sustain a processing temperature of lamination steps with at least 160° C.

The first adhesive layers 113, 123, 133 and the second adhesive layers 114, 124, 134 can be made of polymers having glass transition temperature between 140° C. and 160° C., to facilitate a high temperature (e.g. 160° C.~200° C.) lamination process. The processing temperature of lamination process of a conventional printed circuit board is about 160° C., and thus lamination steps of the present embodiment can be compatible with the high temperature manufacturing process and the manufacturing equipment of the conventional circuit board, wherein no other manufacturing equipment should be developed and the increase of cost can be prevented.

The lamination steps of the present and following embodiments are specified hereinafter. In general, a conventional flexible circuit board is manufactured by performing a fast press process through a Roll-to-Roll equipment. Being different from the fast press process, lamination steps of the present and following embodiments are conducted by using the high temperature lamination process (i.e. batch production) and equipment of the present printed circuit board (i.e. rigid circuit board). Hence, process parameters and process equipment of the two are different. In respect to the process parameters, press time of the lamination steps of the present and following embodiments is longer than press time of the fast press process adopted by the conventional flexible circuit board in about one order. Furthermore, press temperature of the lamination steps of the present and following embodiments is higher than press temperature of the fast press process adopted by the conventional flexible circuit board.

Regarding the existing materials, the product with model no. PE-25F38 provided by Microcosm Technology Co. Ltd can be used to form the first adhesive layer 113, 123, 133 and the second adhesive layer 114, 124, 134. In other words, an adhesive with glass transition temperature ranged from 140° C. to 160° C. and dielectric constant from 2.6 to 2.8 can be formed from the product. It is noted that dielectric constant of an adhesive layer in the conventional flexible circuit board is greater than 3.

Certainly, the product mentioned above is used for merely an available embodiment and provides no limitations to the materials of the adhesive layers of the present application. Based on the disclosure of the present application, one of the ordinary skill in the art may select or develop similar adhesive materials with the same attributes and apply the same to the present application.

According to the roles and the functions of the core unit 110, the lamination unit 120 and the bonding unit 130 in the circuit board process of the present application, the first adhesive layer 113, 123, 133 and the second adhesive layer 114, 124, 134 may be in a cured state (C-stage) or a semi-cured state (B-stage). For example, the first adhesive layer 113 and the second adhesive layer 114 of the core unit 110 are for example in the cured state (C-stage). The first adhesive layer 123 of the lamination unit 120 is for example in the cured state (C-stage), and the second adhesive layer 124 is for example in the semi-cured state (B-stage). The first adhesive layer 133 and the second adhesive layer 134 of the bonding unit 130 are for example in the semi-cured state (B-stage).

In addition, material of the first conductive layer 115, the second conductive layer 116, and the conductive layer 126 is, for example, copper or other applicable conductive material. In the following circuit board process, the first conductive layer 115, the second conductive layer 116, and the conductive layer 126 can be patterned into circuits, or serves as a shielding layer, a ground layer or a power source layer. The releasing layer 128 is for example a releasing sheet, which can be removed in the following circuit board process, so as to expose the second adhesive layer 124 in B-stage state. Material of the first base layer 135 and the second base layer 136 may be poly ethylene terephthalate (PET) substrate or other plastic substrate, for carrying the first adhesive layer 133 and the second adhesive layer 134 in B-stage state.

Figure 2:
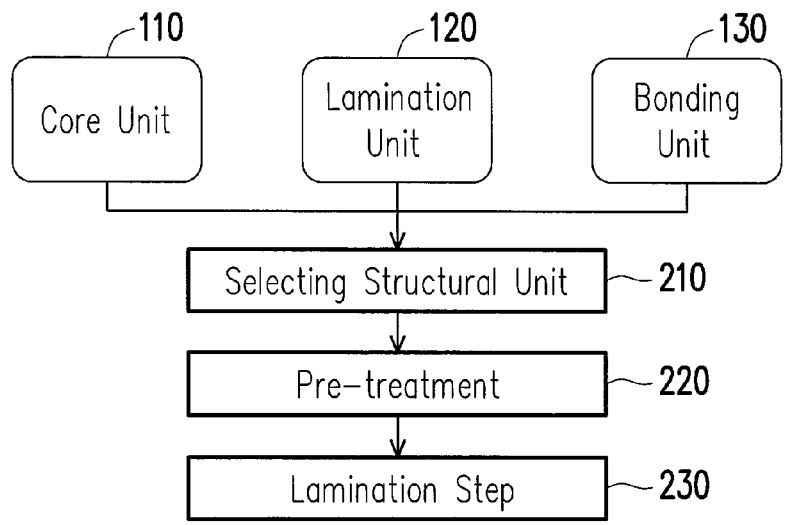
FIG. 2 illustrates a manufacturing method of circuit board according to an embodiment of the present application.

Various types of circuit boards can be formed by using the core unit 110, the lamination unit 120 and the bonding unit 130. In specific, as shown in FIG. 2, two or more structural units in the same type or in different types can be selected from the core unit 110, the lamination unit 120 and the bonding unit 130 (step 210). And, pre-treatments to the selected structural units are respectively conducted (step 220). Then, one or more lamination steps are performed with a temperature between 160° C. and 200° C. to laminate the selected structural units, and cure and B-stage adhesive layer, such as the second adhesive layer 124, and the first adhesive layer 133 and adhesive layer 134 of the bonding unit 130 (step 230).

Therefore, the plural structural units can be bonded through their corresponding first adhesive layer 133 or second adhesive layers 124, 134.

The following embodiments will further describe multi-layered circuit boards and their processes accomplished by the above structural units and process thereof.

FIGS. 3A through 3F illustrate a manufacturing process of four layered circuit board according to an embodiment of the present application.

Figure 3A:
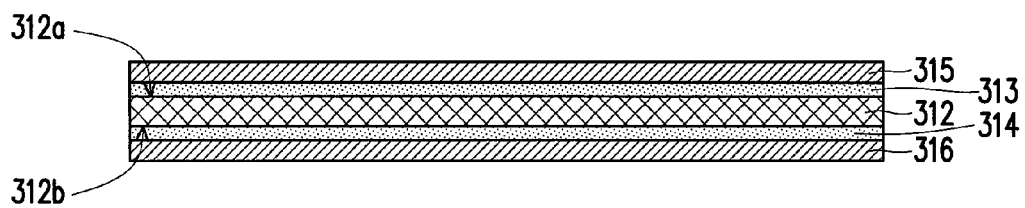
FIGS. 3A through 3F illustrate a manufacturing process of four layered circuit board according to an embodiment of the present application.

A core unit 310 is provided first, as shown in FIG. 3A. Here, the core unit 110 of FIG. 1A is selected to serve as the core unit 310 of the present embodiment. The core unit 310 includes a first polyimide layer 312, a first adhesive layer 313, a second adhesive layer 314, a first conductive layer 315 and a second conductive layer 316. The first adhesive layer 313 and the second adhesive layer 314 are respectively disposed on a first surface 312a and a second surface 312b of the first polyimide layer 312. The first conductive layer 315 is disposed on the first adhesive layer 313. The second conductive layer 316 is disposed on the second adhesive layer 314.

Figure 3B:
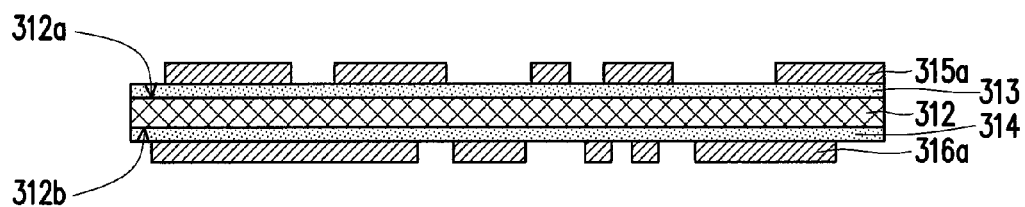

Owing to adopting the core unit 110 of FIG. 1A to serve as the core unit 310 of the present embodiment, the pre-treatment (step 220) of FIG. 2 can further be conducted to the core unit 310. Referring to FIG. 3B, the first conductive layer 315 and the second conductive layer 316 can be respectively patterned, so as to form a first circuit layer 315a and a second circuit layer 316a. In other embodiments, the first conductive layer 315 and the second conductive layer 316 may not be patterned, and can serve as a signal reference plane, a power source plane or a ground plane.

Figure 3C:
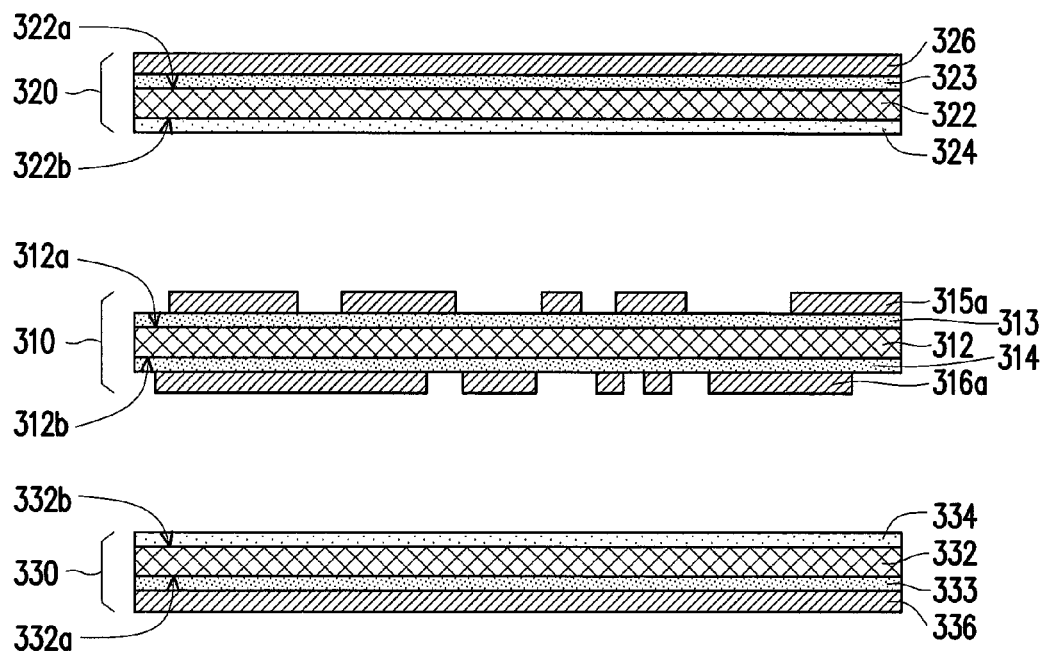

Then, as shown in FIG. 3C, a first lamination unit 320 and a second lamination unit 330 are respectively provided at two opposite sides of the core unit 310. Here, the core unit 120 of FIG. 1B is selected to serve as the first lamination unit 320 and the second lamination unit 330, wherein the releasing layer 128 of the lamination unit 120 of FIG. 1B is removed (step 220) as illustrated in FIG. 2, to expose the second adhesive layer 124 and obtain the first lamination unit 320 and the second lamination unit 330 of the present embodiment.

The first lamination unit 320 includes a second polyimide layer 322, a third adhesive layer 323, a fourth adhesive layer 324 and a third conductive layer 326. The third adhesive layer 323 and the fourth adhesive layer 324 are respectively disposed on a third surface 322a and a fourth surface 322b of the second polyimide layer 322. The fourth adhesive layer 324 is exposed and faces the first conductive layer 315 (the first circuit layer 315a). The third conductive layer 326 is disposed on the third adhesive layer 323.

The second lamination unit 330 includes a third polyimide layer 332, a fifth adhesive layer 333, a sixth adhesive layer 334 and a fourth conductive layer 336. The fifth adhesive layer 333 and the sixth adhesive layer 334 are respectively disposed on a fifth surface 332a and a sixth surface 332b of the third polyimide layer 332. The sixth adhesive layer 334 is exposed and faces the second conductive layer 316 (the second circuit layer 316a). The fourth conductive layer 336 is disposed on the fifth adhesive layer 333.

Figure 3D:
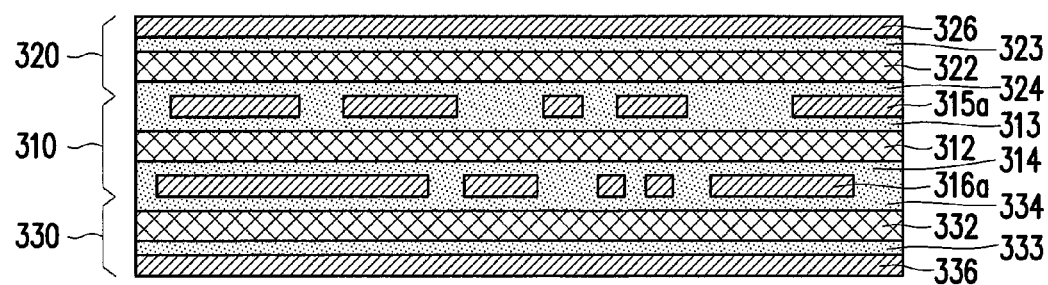

Next, as shown in FIG. 3D, a lamination step is performed with a temperature higher than 160° C. to laminate the first lamination unit 320, the core unit 310 and the second lamination unit 330 together, wherein the fourth adhesive layer 324 is bonded to the first conductive layer 315 (the first circuit layer 315a), and the sixth adhesive layer 334 is bonded to the second conductive layer 316 (the second circuit layer 316a). In this step, the fourth adhesive layer 324 and the sixth adhesive layer 334 are transformed from the semi-cured state (B-stage) to the cured state (C-stage).

As to the above, since the adhesive layers of the core unit, the lamination unit and the bonding unit are capable of sustaining high temperature, the lamination step of the present embodiment is compatible with the high temperature manufacturing process and the manufacturing equipment of the conventional circuit board, wherein no other manufacturing apparatus should be developed and the increase of cost can be prevented. The press temperature of the aforementioned lamination step is between about 160° C. and 200° C.

Figure 3E:
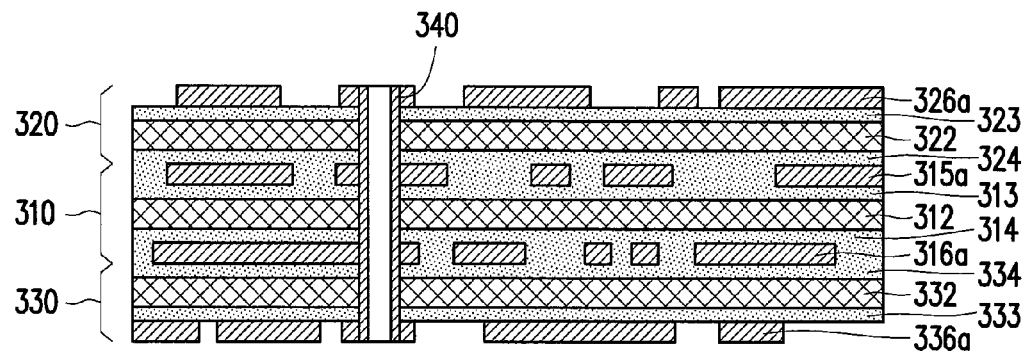

Then, as shown in FIG. 3E, a conductive via 340 penetrating the first lamination unit 320, the core unit 310 and the second lamination unit 330 is formed to electrically connect the third conductive layer 326, the first circuit layer 315a (the first conductive layer 315), the second circuit layer 316a (the second conductive layer 316) and the fourth conductive layer 336. And, the third conductive layer 326 and the fourth conductive layer 336 are patterned to respectively form a third circuit layer 326a and a fourth circuit layer 336a. In other words, the conductive via 340 of the present embodiment is a plating through hole (PTH) for conducting four circuit layers, including the third circuit layer 326a, the first circuit layer 315a, the second circuit layer 316a and the fourth circuit layer 336a.

However, in other embodiment of the present application, the conductive via 340 can further be formed in a part of the first lamination unit 320, the core unit 310 and the second lamination unit 330 to electrically connect at least two of the third circuit layer 326a, the first circuit layer 315a, the second circuit layer 316a and the fourth circuit layer 336a, by altering the process steps and circuit layouts. For example, the conductive via 340 is formed in the first lamination unit 320 and the core unit 310 to electrically connect the third circuit layer 326a, the first circuit layer 315a and the second circuit layer 316a. Otherwise, the conductive via 340 can be exclusively formed in the first lamination unit 320 to electrically connect the third circuit layer 326a and the first circuit layer 315a.

Figure 3F:
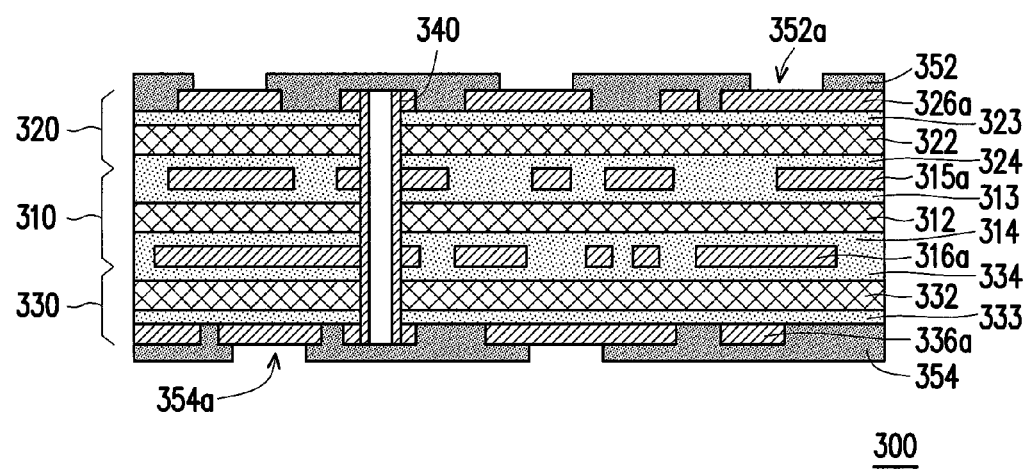

Then, as shown in FIG. 3F, a first solder mask layer 352 and a second solder mask layer 354 are respectively formed on the third circuit layer 326a and the fourth circuit layer 336a. The first solder mask layer 352 has one or more openings 352a for exposing parts of the third circuit layer 326a to form one or more external contacts. The second solder mask layer 354 has one or more openings 354a for exposing parts of the fourth circuit layer 336a to form one or more external contacts. Thereby, the fabrication of the four layered circuit board 300 of the present embodiment is approximately completed.

In comparing with the conventional four layered flexible circuit board, which required two steps of fast press process to laminated two outermost circuit layers and a cover layer (e.g. PET substrate), the present embodiment forms the four layered circuit board by only one lamination step. Hence, the manufacturing process is simplified.

FIGS. 4A through 4I illustrate a manufacturing process of six layered circuit board according to an embodiment of the present application.

Figure 4A:
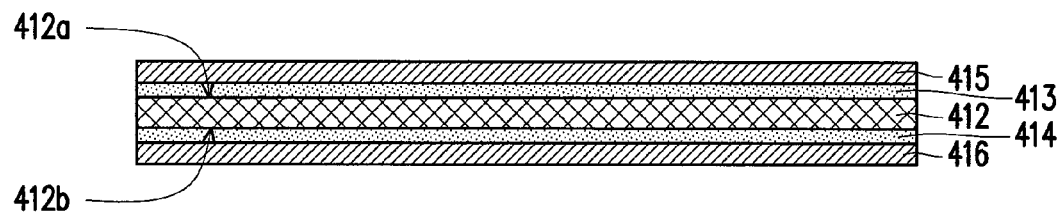
FIGS. 4A through 4I illustrate a manufacturing process of six layered circuit board according to an embodiment of the present application.

A core unit 410 is provided first, as shown in FIG. 4A. Here, the core unit 110 of FIG. 1A is selected to serve as the core unit 410 of the present embodiment. The core unit 410 includes a first polyimide layer 412, a first adhesive layer 413, a second adhesive layer 414, a first conductive layer 415 and a second conductive layer 416. The first adhesive layer 413 and the second adhesive layer 414 are respectively disposed on a first surface 412a and a second surface 412b of the first polyimide layer 412. The first conductive layer 415 is disposed on the first adhesive layer 413. The second conductive layer 416 is disposed on the second adhesive layer 414.

Figure 4B:
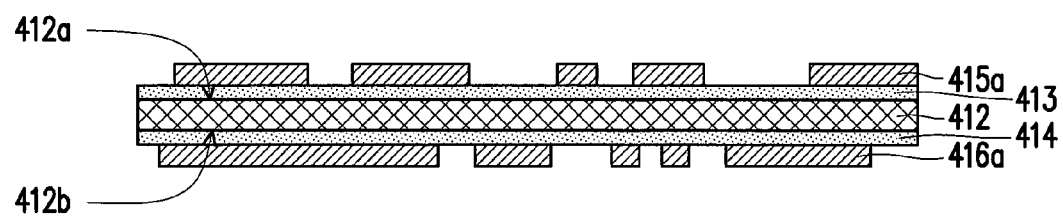

Owing to adopting the core unit 110 of FIG. 1A to serve as the core unit 410 of the present embodiment, the pre-treatment (step 220) of FIG. 2 can further be conducted to the core unit 410. Referring to FIG. 4B, the first conductive layer 415 and the second conductive layer 416 can be respectively patterned, so as to form a first circuit layer 415a and a second circuit layer 416a. In other embodiments, the first conductive layer 415 and the second conductive layer 416 may not be patterned, and can serve as a signal reference plane, a power source plane or a ground plane.

Figure 4C:
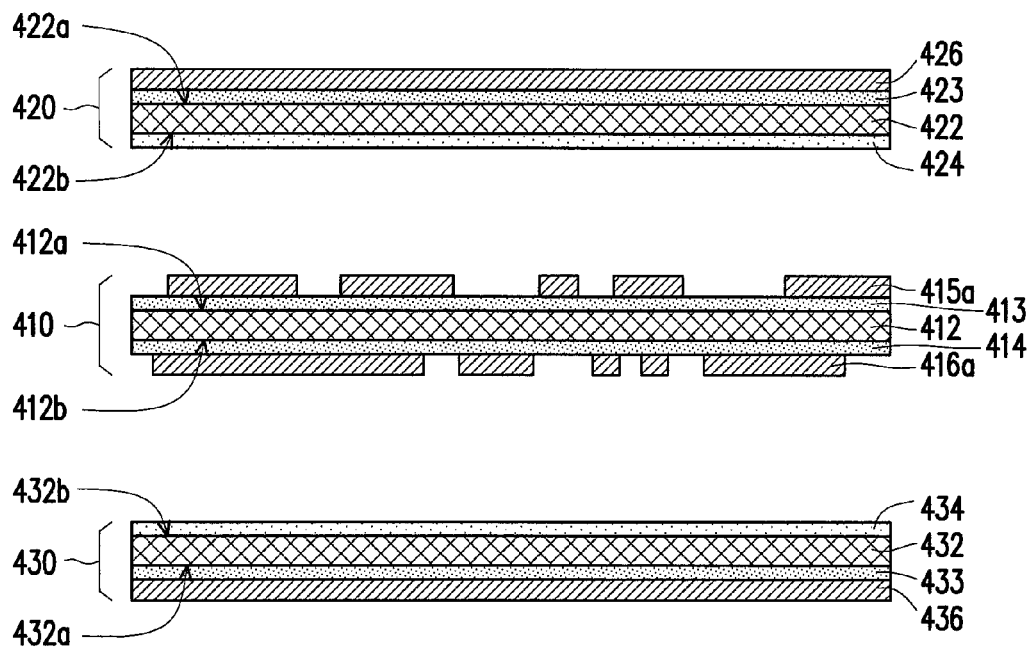

Then, as shown in FIG. 4C, a first lamination unit 420 and a second lamination unit 430 are respectively provided at two opposite sides of the core unit 410. Here, the core unit 120 of FIG. 1B is selected to serve as the first lamination unit 420 and the second lamination unit 430, wherein the releasing layer 128 of the lamination unit 120 of FIG. 1B is removed (step 220) as illustrated in FIG. 2, to expose the second adhesive layer 124 and obtain the first lamination unit 420 and the second lamination unit 430 of the present embodiment.

The first lamination unit 420 includes a second polyimide layer 422, a third adhesive layer 423, a fourth adhesive layer 424 and a third conductive layer 426. The third adhesive layer 423 and the fourth adhesive layer 424 are respectively disposed on a third surface 422a and a fourth surface 422b of the second polyimide layer 422. The fourth adhesive layer 424 is exposed and faces the first conductive layer 415 (the first circuit layer 415a). The third conductive layer 426 is disposed on the third adhesive layer 423.

The second lamination unit 430 includes a third polyimide layer 432, a fifth adhesive layer 433, a sixth adhesive layer 434 and a fourth conductive layer 436. The fifth adhesive layer 433 and the sixth adhesive layer 434 are respectively disposed on a fifth surface 432a and a sixth surface 432b of the third polyimide layer 432. The sixth adhesive layer 434 is exposed and faces the second conductive layer 416 (the second circuit layer 416a). The fourth conductive layer 436 is disposed on the fifth adhesive layer 433.

Figure 4D:
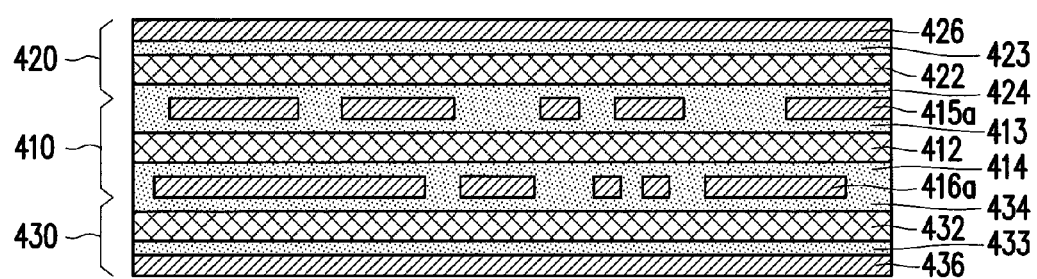

Next, as shown in FIG. 4D, a first lamination step is performed with a temperature higher than 160° C. to laminate the first lamination unit 420, the core unit 410 and the second lamination unit 430 together, wherein the fourth adhesive layer 424 is bonded to the first conductive layer 415 (the first circuit layer 415a), and the sixth adhesive layer 434 is bonded to the second conductive layer 416 (the second circuit layer 416a). In this step, the fourth adhesive layer 424 and the sixth adhesive layer 434 are transformed from the semi-cured state (B-stage) to the cured state (C-stage). The press temperature of the aforementioned lamination step is between about 160° C. and 200° C.

Figure 4E:
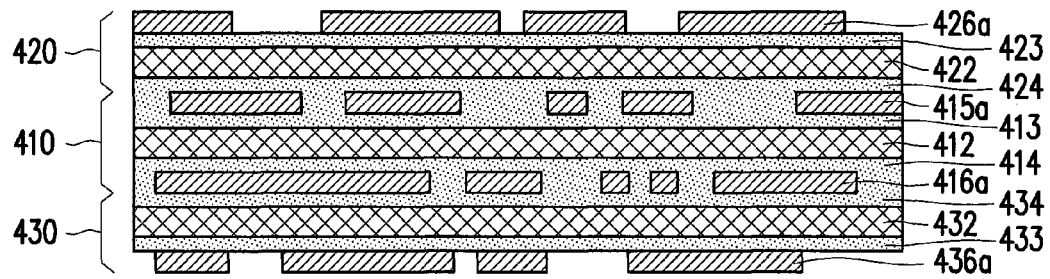

Referring to FIG. 4E, the third conductive layer 426 and the fourth conductive layer 436 can be optionally patterned to form a third circuit layer 426a and a fourth circuit layer 436a.

Figure 4F:
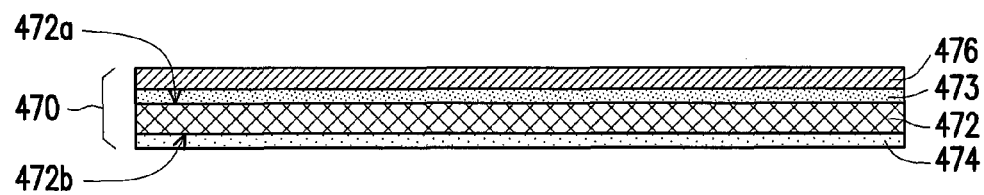
Figure 4F:
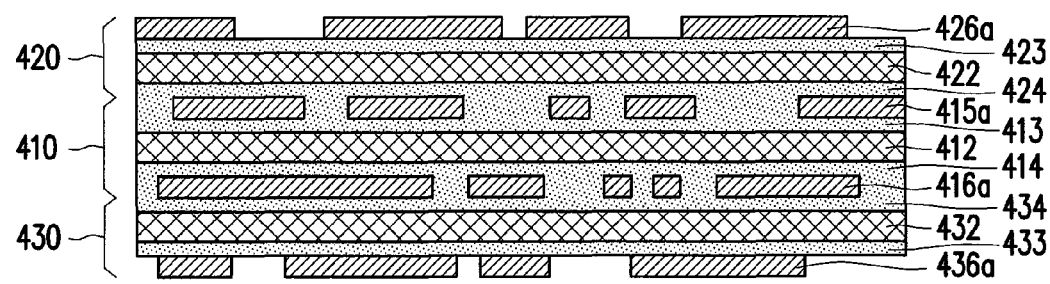
Figure 4F:
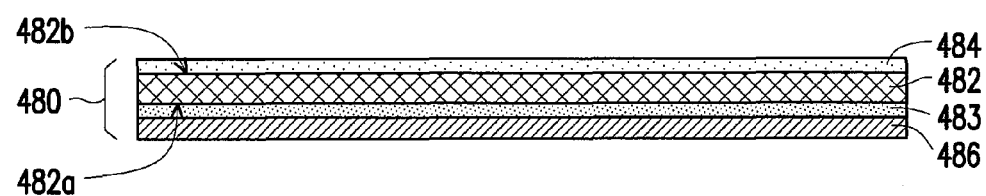

Then, as shown in FIG. 4F, another first lamination unit 470 is provided on the prior first lamination unit 420, and another second lamination unit 480 is provided on the prior second lamination unit 430. Here, the core unit 120 of FIG. 1B is selected to serve as the first lamination unit 470 and the second lamination unit 480, wherein the releasing layer 128 of the lamination unit 120 of FIG. 1B is removed (step 220) as illustrated in FIG. 2, to expose the second adhesive layer 124 and obtain the first lamination unit 470 and the second lamination unit 480 of the present embodiment.

The first lamination unit 470 includes a second polyimide layer 472, a third adhesive layer 473, a fourth adhesive layer 474 and a third conductive layer 476. The third adhesive layer 473 and the fourth adhesive layer 474 are respectively disposed on a third surface 472a and a fourth surface 422b of the second polyimide layer 472. The fourth adhesive layer 474 is exposed and faces the third circuit layer 426a. The third conductive layer 476 is disposed on the third adhesive layer 473.

The second lamination unit 480 includes a third polyimide layer 482, a fifth adhesive layer 483, a sixth adhesive layer 484 and a fourth conductive layer 486. The fifth adhesive layer 483 and the sixth adhesive layer 484 are respectively disposed on a fifth surface 482a and a sixth surface 482b of the third polyimide layer 482. The sixth adhesive layer 484 is exposed and faces the fourth circuit layer 436a of the prior second lamination unit 430. The fourth conductive layer 486 is disposed on the fifth adhesive layer 483.

Figure 4G:
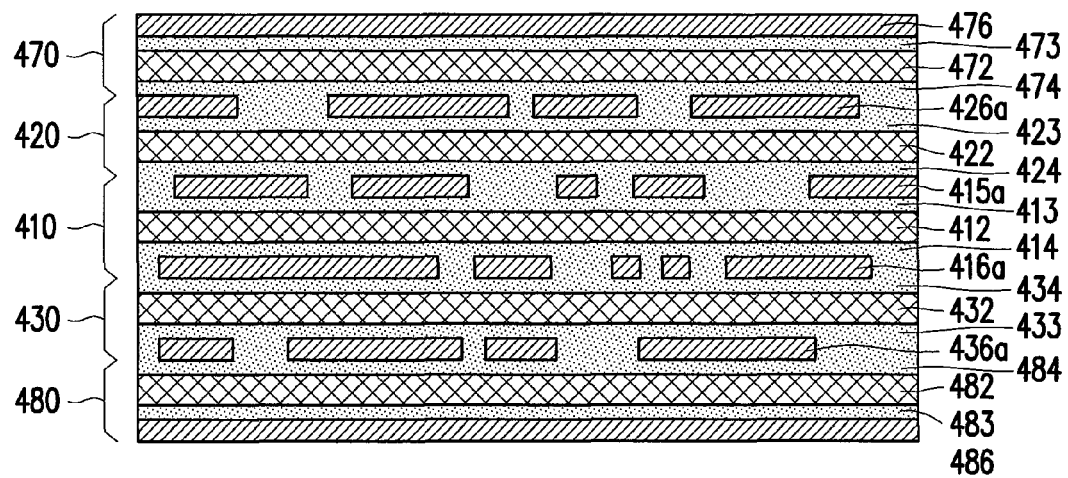

Next, as shown in FIG. 4G, a second lamination step is performed with a temperature higher than 160° C. to laminate the first lamination unit 470, the first lamination unit 420, the core unit 410, the second lamination unit 430 and the second lamination unit 480 together, wherein the fourth adhesive layer 424 is bonded to the third conductive layer 426 (the third circuit layer 426a), and the sixth adhesive layer 484 is bonded to the fourth conductive layer 436 (the fourth circuit layer 436a). In this step, the fourth adhesive layer 474 and the sixth adhesive layer 484 are transformed from the semi-cured state (B-stage) to the cured state (C-stage). The press temperature of the aforementioned second lamination step is between about 160° C. and 200° C.

Figure 4H:
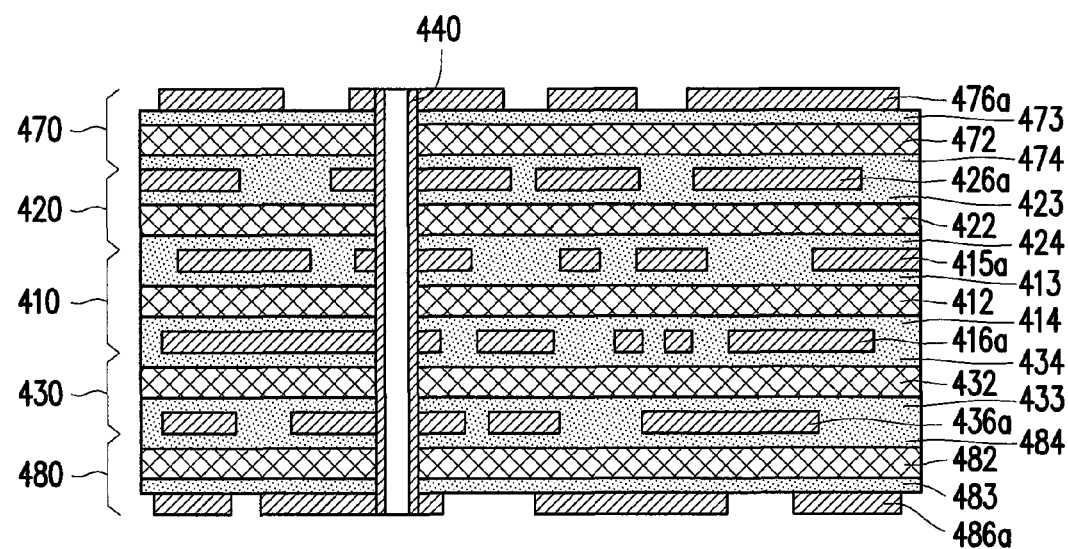

Then, as shown in FIG. 4H, a conductive via 440 penetrating the first lamination unit 470, the first lamination unit 420, the core unit 310, the second lamination unit 430 and the second lamination unit 480 is formed to electrically connect the third conductive layer 476, the third circuit layer 426a, the first circuit layer 415a, the second circuit layer 416a, the fourth circuit layer 436a and the fourth conductive layer 486. And, the third conductive layer 476 and the fourth conductive layer 486 are patterned to respectively form a third circuit layer 476a and a fourth circuit layer 486a. In other words, the conductive via 440 of the present embodiment is a plating through hole (PTH) for conducting six circuit layers, including the third circuit layer 476a, the third circuit layer 426a, the first circuit layer 415a, the second circuit layer 416a, the fourth circuit layer 436a and the fourth circuit layer 486a.

However, in other embodiment of the present application, the conductive via 440 can further be formed in a part of the first lamination unit 470, the first lamination unit 420, the core unit 310, the second lamination unit 430 and the second lamination unit 480 to electrically connect at least two of the third circuit layer 476a, the third circuit layer 426a, the first circuit layer 415a, the second circuit layer 416a, the fourth circuit layer 436a and the fourth circuit layer 486a, by altering the process steps and circuit layouts. For example, the conductive via 440 is formed in the first lamination unit 470, the first lamination unit 420 and the core unit 410 to electrically connect the third circuit layer 476a, the third circuit layer 426a, the first circuit layer 415a and the second circuit layer 416a. Otherwise, the conductive via 440 can be formed in the first lamination unit 470 and the first lamination unit 420 to electrically connect the third circuit layer 476a, the third circuit layer 426a and the first circuit layer 415a.

Figure 4I:
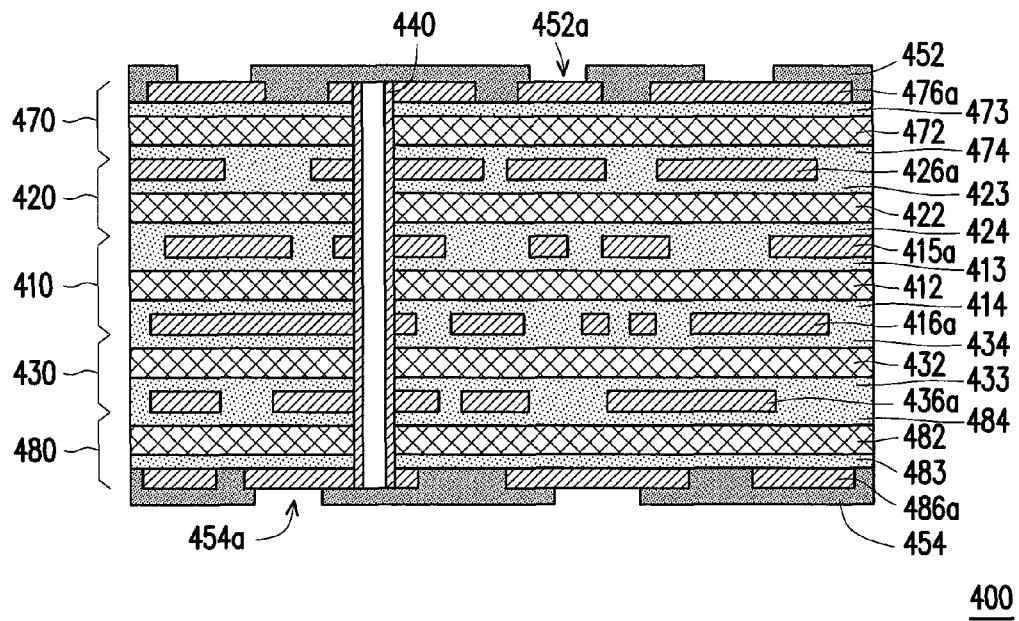

Then, as shown in FIG. 4I, a first solder mask layer 452 and a second solder mask layer 454 are respectively formed on the third circuit layer 476a and the fourth circuit layer 486a. The first solder mask layer 452 has one or more openings 452a for exposing parts of the third circuit layer 476a to form one or more external contacts. The second solder mask layer 454 has one or more openings 454a for exposing parts of the fourth circuit layer 486a to form one or more external contacts.

Thereby, the fabrication of the four layered circuit board 400 of the present embodiment is approximately completed.

According to the above embodiments, one or more lamination unit 120 of FIG. 1B can be bonded to one side or two opposite sides of the core unit 110 of FIG. 1A, to form various types of multi-layered circuit boards, which are not restricted to the four layered circuit board 300 of FIG. 3F or the six layered circuit board 400 of FIG. 4I.

For example, after the second lamination step of FIG. 4G, further another first lamination unit and further another second lamination unit can be provided on the first lamination unit 470 and the second lamination unit 480, and another second lamination step can be performed with a temperature higher than 160° C. to bond the newly added first lamination unit on the prior first lamination unit 470, and bond the newly added second laminate unit on the prior second lamination unit 480. Furthermore, steps of patterning of conductive layers and forming of conductive via can be selectively conducted to form an eight layered circuit board.

Certainly, the above steps can further be repeated to form a circuit board with more layers in even numbers. The descriptions about this part are omitted.

The present application is also directed to a structure of flexible-rigid composite circuit board. The core unit 110, the lamination unit 120 and the bonding unit 130 as mentioned above can be used to form a flexible-rigid composite circuit board in the following embodiment.

FIGS. 5A through 5I illustrate a manufacturing process of circuit board according to an embodiment of the present application.

Figure 5A:
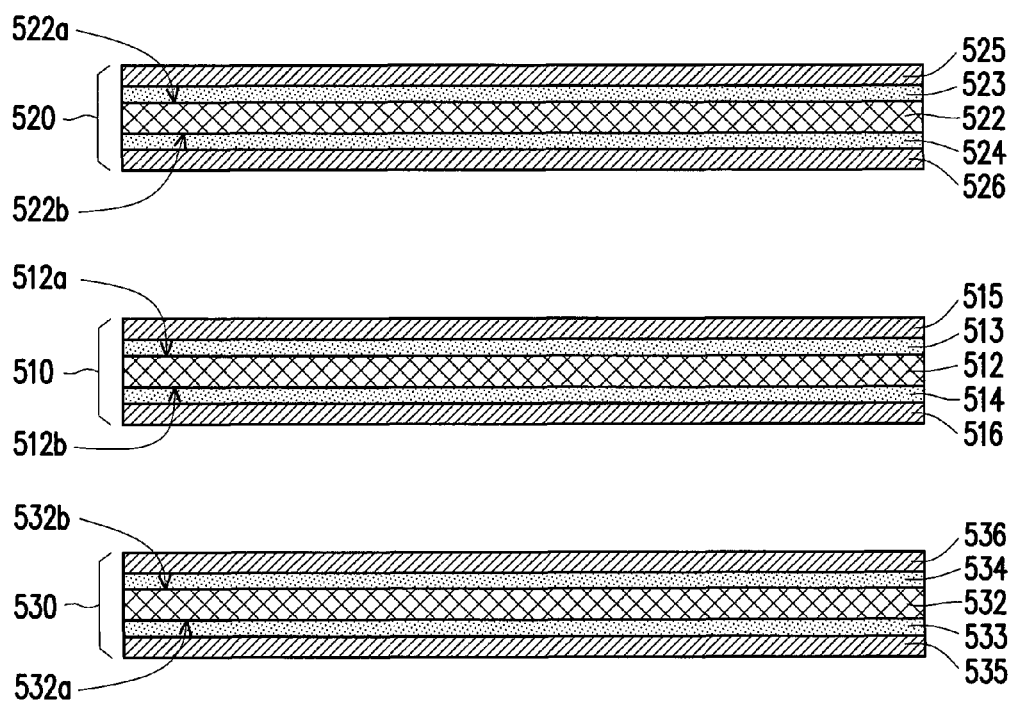
FIGS. 5A through 5I illustrate a manufacturing process of circuit board according to an embodiment of the present application.

Firstly, a first core unit 510, a second core unit 520 and a third core unit 530 are provided, as shown in FIG. 5A. Here, the core unit 110 of FIG. 1A is selected to serve as the first core unit 510, the second core unit 520 and the third core unit 530 of the present embodiment. The second core unit 520 and the third core unit 530 are respectively disposed at two opposite sides of the first core unit 510.

The first core unit 510 includes a first polyimide layer 512, a first adhesive layer 513, a second adhesive layer 514, a first conductive layer 515 and a second conductive layer 516. The first adhesive layer 513 and the second adhesive layer 514 are respectively disposed on a first surface 512a and a second surface 512b of the first polyimide layer 512. The first conductive layer 515 is disposed on the first adhesive layer 513. The second conductive layer 516 is disposed on the second adhesive layer 514.

The second core unit 520 includes a second polyimide layer 522, a third adhesive layer 523, a fourth adhesive layer 524, a third conductive layer 525 and a fourth conductive layer 526. The third adhesive layer 523 and the fourth adhesive layer 524 are respectively disposed on a third surface 522a and a fourth surface 522b of the second polyimide layer 522. The third conductive layer 525 is disposed on the third adhesive layer 523. The fourth conductive layer 526 is disposed on the fourth adhesive layer 524 and faces the first conductive layer 515.

The third core unit 530 includes a third polyimide layer 532, a fifth adhesive layer 533, a sixth adhesive layer 534, a fifth conductive layer 535 and a sixth conductive layer 536. The fifth adhesive layer 533 and the sixth adhesive layer 534 are respectively disposed on a fifth surface 532a and a sixth surface 532b of the third polyimide layer 532. The fifth conductive layer 535 is disposed on the fifth adhesive layer 533. The sixth conductive layer 536 is disposed on the sixth adhesive layer 534 and faces the second conductive layer 516.

Figure 5B:
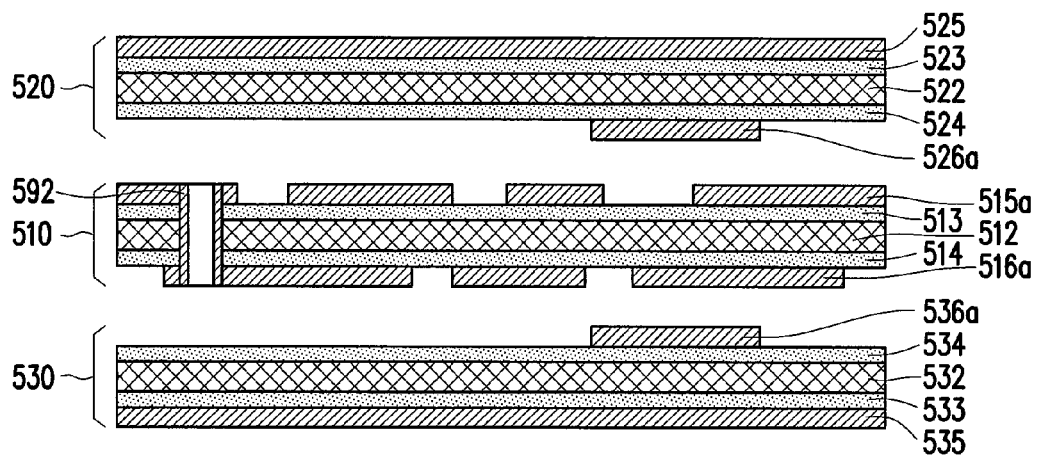

Owing to adopting the core unit 110 of FIG. 1A to serve as the first core unit 510, the second core unit 520 and the third core unit 530 of the present embodiment, the pre-treatment (step 220) of FIG. 2 can further be conducted to the first core unit 510, the second core unit 520 and the third core unit 530. Referring to FIG. 5B, the first conductive layer 515 and the second conductive layer 516 of the first core unit 510 can be optionally patterned to form a first circuit layer 515a and a second circuit layer 516a. Additionally, a first conductive via 592 can be formed in the first core unit 510 to electrically connect the first circuit layer 515a (the first conductive layer) and the second circuit layer 516a (the second conductive layer 516). Further, the fourth conductive layer 526 of the second core unit 520 and the sixth conductive layer 536 of the third core unit 530 can also be optionally patterned to form shielding patterns 526a and 536a. In other embodiments, the conductive layers of the core units can be patterned or not, and can serve as a signal reference plane, a power source plane or a ground plane, etc.

Figure 5C:
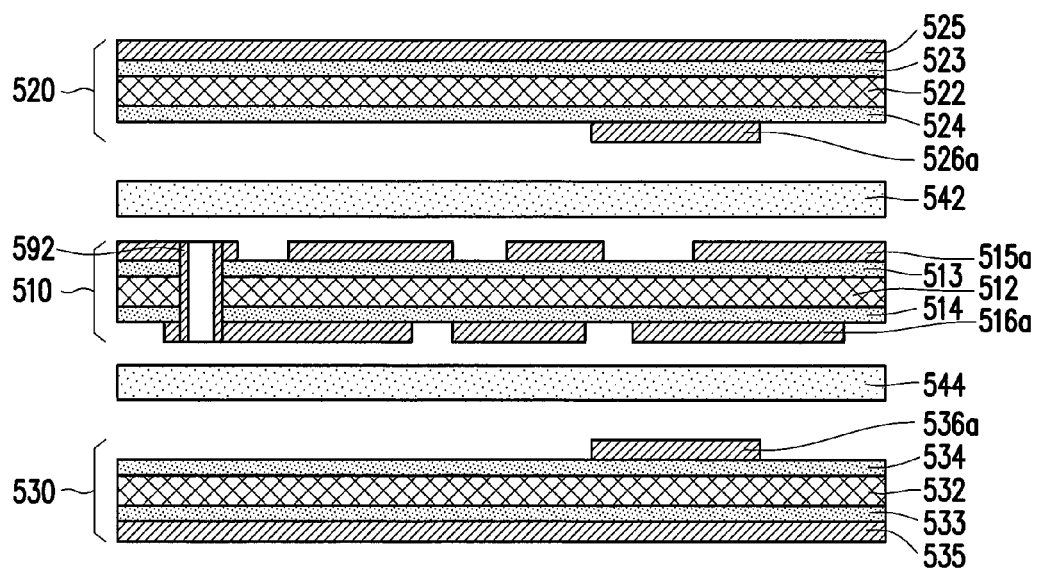

Then, as shown in FIG. 5C, a seventh adhesive layer 542 is provided between the first core unit 510 and the second core unit 520, and an eighth adhesive layer 544 is provided between the first core unit 510 and the third core unit 530. Here, the seventh adhesive layer 542 and the eighth adhesive layer 544 are in the semi-cured state (B-stage), and can be made of the same material as the first adhesive layer 513, the second adhesive layer 514, the third adhesive layer 523, the fourth adhesive layer 524, the fifth adhesive layer 533 and the sixth adhesive layer 534.

Figure 5D:
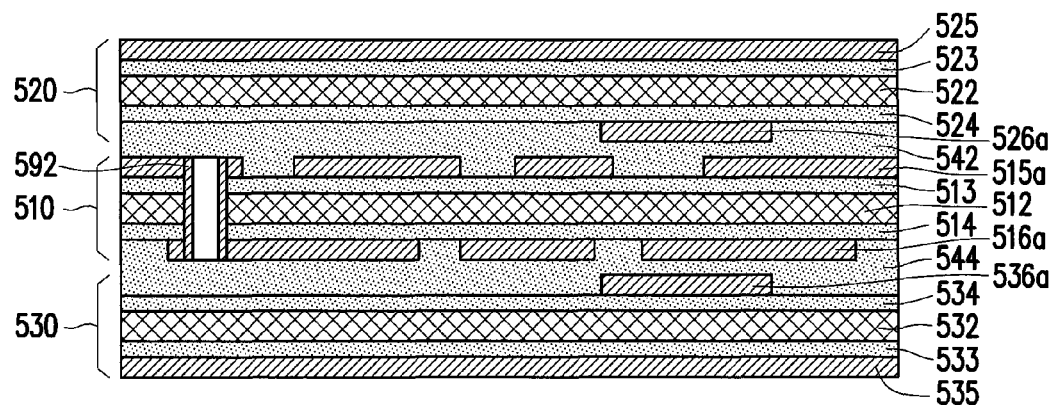

Next, as shown in FIG. 5D, a first lamination step is performed with a temperature higher than 160° C. to laminate the first core unit 510, the second core unit 520 and the third core unit 530 together, wherein the fourth conductive layer 526 is bonded to the first conductive layer 515 through the seventh adhesive layer 542, and the sixth conductive layer 536 is bonded to the second conductive layer 516 through the eighth adhesive layer 544. In this step, the seventh adhesive layer 542 and the eighth adhesive layer 544 are transformed from the semi-cured state (B-stage) to the cured state (C-stage). The press temperature of the aforementioned first lamination step is between about 160° C. and 200° C.

Figure 5E:
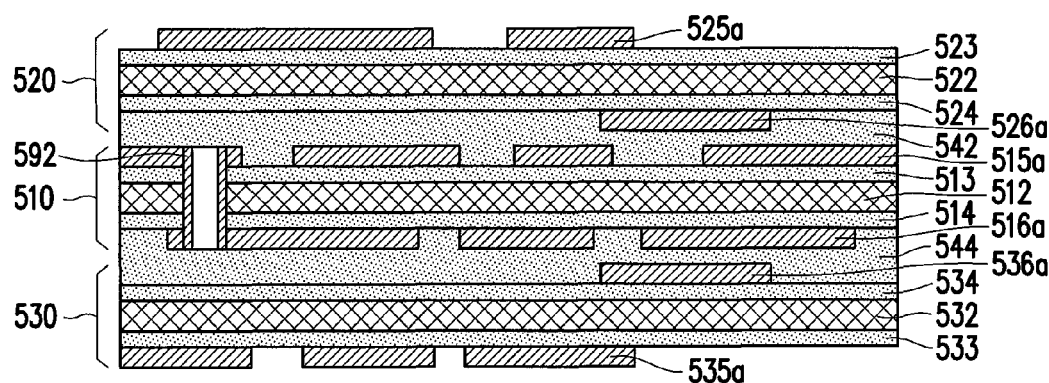

Then, referring to FIG. 5E, the third conductive layer 525 of the second core unit 520 and the fifth conductive layer 535 of the third core unit 530 can be optionally patterned. Here, parts of the third conductive layer 525 and the fifth conductive layer 535 in the first region A1 are removed, and the remaining parts of the third conductive layer 525 and the fifth conductive layer 535 are patterned into a third circuit layer 525a and a fifth circuit layer 535a.

Figure 5F:
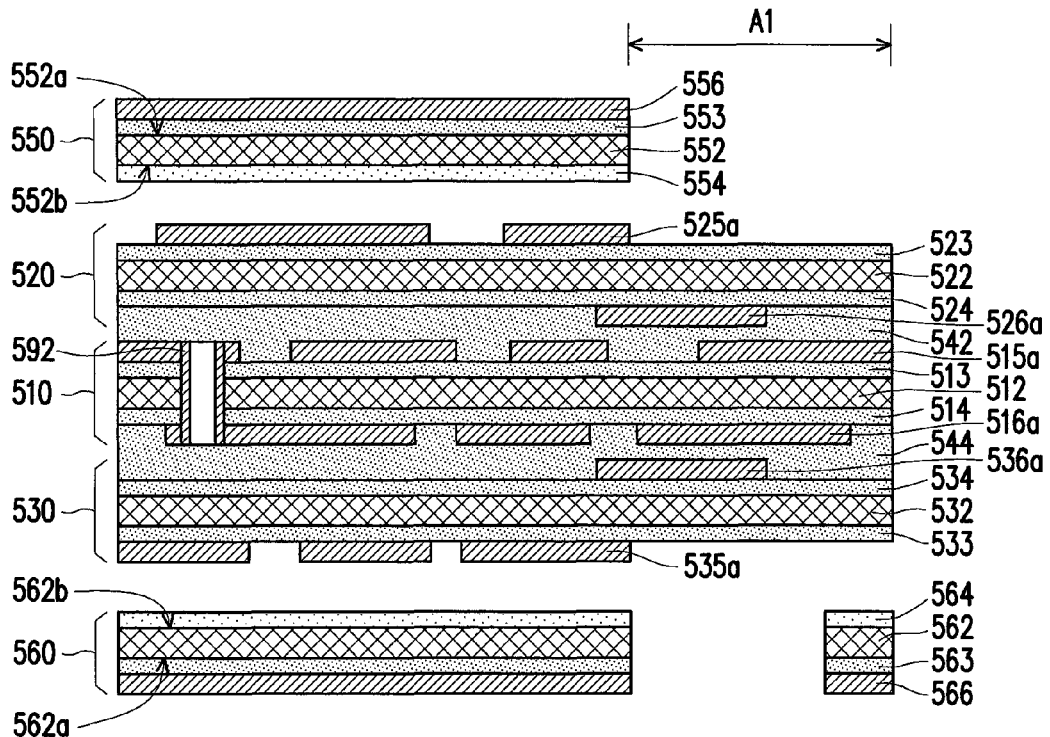

Then, as shown in FIG. 5F, a first lamination unit 550 and a second lamination unit 560 are respectively provided at two opposite sides of the first core unit 510. Here, the core unit 120 of FIG. 1B is selected to serve as the first lamination unit 550 and the second lamination unit 560, wherein the releasing layer 128 of the lamination unit 120 of FIG. 1B is removed (step 220) as illustrated in FIG. 2, to expose the second adhesive layer 124 and obtain the first lamination unit 550 and the second lamination unit 560 of the present embodiment.

The first lamination unit 550 includes a fourth polyimide layer 552, a ninth adhesive layer 553, a tenth adhesive layer 554 and a seventh conductive layer 556. The ninth adhesive layer 553 and the tenth adhesive layer 554 are respectively disposed on a seventh surface 552a and an eighth surface 552b of the fourth polyimide layer 552. The tenth adhesive layer 554 is exposed and faces the third conductive layer 525. The seventh conductive layer 556 is disposed on the ninth adhesive layer 553.

The second lamination unit 560 includes a fifth polyimide layer 562, an eleventh adhesive layer 563, a twelfth adhesive layer 564 and an eighth conductive layer 566. The eleventh adhesive layer 563 and the twelfth adhesive layer 564 are respectively disposed on a ninth surface 562a and a tenth surface 562b of the fifth polyimide layer 562. The twelfth adhesive layer 564 is exposed and faces the fifth conductive layer 535. The eighth conductive layer 566 is disposed on the eleventh adhesive layer 563.

Figure 5G:
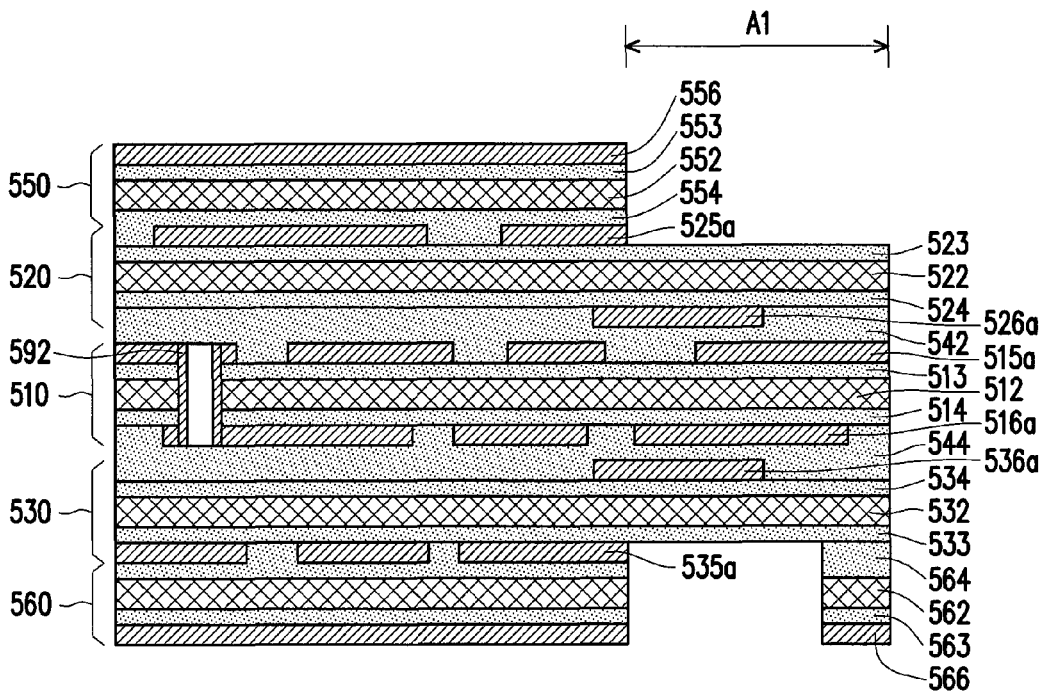

Next, as shown in FIG. 5G, a second lamination step is performed with a temperature higher than 160° C. to laminate the first lamination unit 550, the second lamination unit 560, the first core unit 510, the second core unit 520 and the third core unit 530 together, wherein the tenth adhesive layer 554 is bonded to the third conductive layer 525, and the twelfth adhesive layer 564 is bonded to the fifth conductive layer 535. In this step, the tenth adhesive layer 554 and the twelfth adhesive layer 564 are transformed from the semi-cured state (B-stage) to the cured state (C-stage).

Prior to the second lamination step, the part of the first lamination unit 550 in the first region A1 can be removed, such that the first lamination unit 550 can expose the third adhesive layer 523 in the first region A1 with the third conductive layer 525 after being laminated to the second core unit 520. Similarly, prior to the second lamination step, the part of the second lamination unit 560 in the first region A1 can be removed, such that the second lamination unit 560 can expose the fifth adhesive layer 533 in the first region A1 with the fifth conductive layer 535 after being laminated to the third core unit 530. The press temperature of the aforementioned second lamination step is between about 160° C. and 200° C.

Figure 5H:
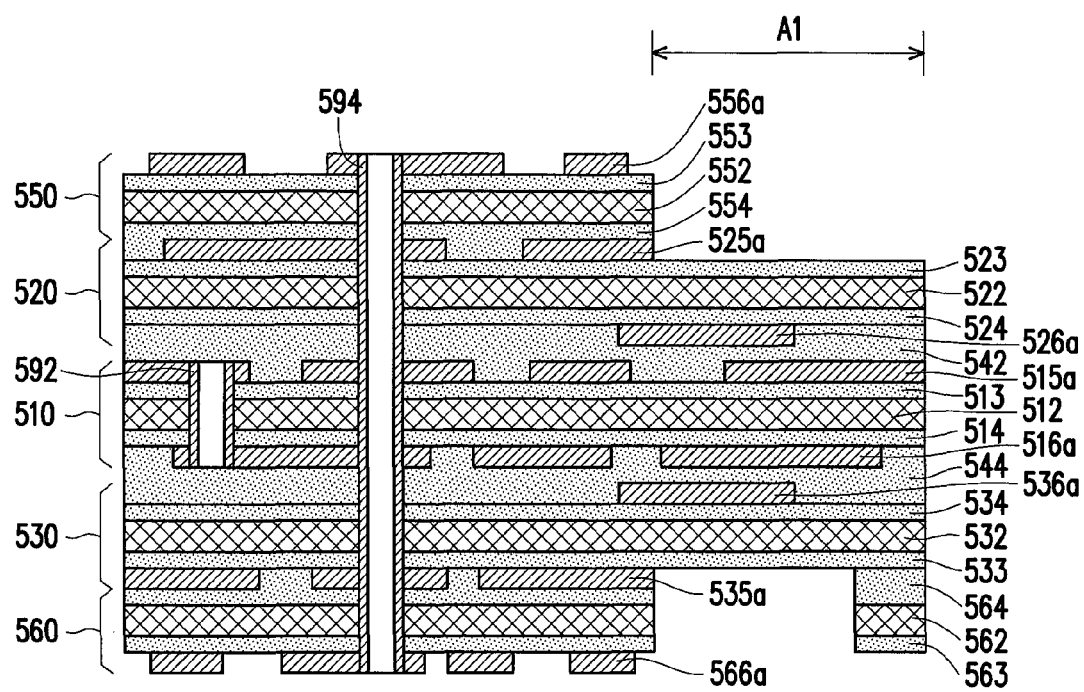

Then, referring to FIG. 5H, the seventh conductive layer 556 of the first lamination unit 550 and the eighth conductive layer 566 of the second lamination unit 560 can be optionally patterned to form a seventh circuit layer 556a and an eighth circuit layer 566a. In the present embodiment, a second conductive via 594 can be formed in a part of the first lamination unit 550, the second core unit 520, the first core unit 510, the third core unit 530 and the second lamination unit 560 to electrically connect at least two of the seventh conductive layer 556, the third conductive layer 525, the fourth conductive layer 526, the first conductive layer 515, the second conductive layer 516, the sixth conductive layer 536, the fifth conductive layer 535 and the eight conductive layer 566. Here, the second conductive via 594 penetrates the first lamination unit 550, the second core unit 520, the first core unit 510, the third core unit 530 and the second lamination unit 560 to electrically connect the seventh conductive layer 556, the third conductive layer 525, the fourth conductive layer 526, the first conductive layer 515, the second conductive layer 516, the sixth conductive layer 536, the fifth conductive layer 535 and the eight conductive layer 566.

In addition, a part of the second core unit 520 and apart of the seventh adhesive layer 542 in the first region A1 can further be removed by laser cutting in the present embodiment to expose a part of the first conductive layer 515 and form a plurality of conductive terminals T. However, the part of the seventh adhesive layer 542 in the first region A1 can also be removed before the first lamination step of FIG. 5D. The time point of removing the part of the seventh adhesive layer 542 is not limited herein.

Figure 5I:
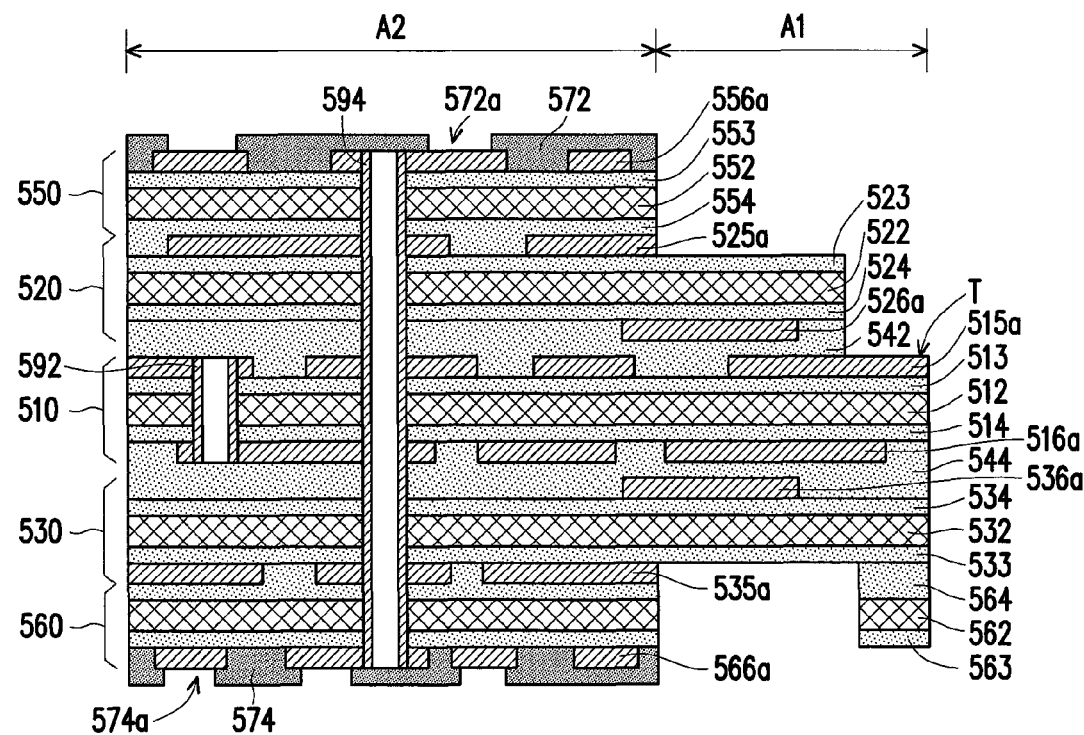

Then, as shown in FIG. 5I, a first solder mask layer 572 and a second solder mask layer 574 are respectively formed on the seventh conductive layer 556 (the seventh circuit layer 556a) and the eighth conductive layer 566 (the eighth circuit layer 566a). The first solder mask layer 572 has one or more openings 572a for exposing parts of the seventh circuit layer 556a to form one or more external contacts. The second solder mask layer 574 has one or more openings 574a for exposing parts of the eighth circuit layer 566a to form one or more external contacts.

Accordingly, the fabrication of the circuit board 500 is approximately completed. The circuit board 500 fabricated by the present embodiment has a thinner part in the first region A1 and a thicker part in the second region A2. The thinner part of the circuit board 500, as a flexible circuit board, is flexible and provided with conductive terminals T serving as external contacts. In addition, the thicker part of the circuit board 500 in the second region A2, as a printed circuit board, has a multi-layered circuit structure formed by lamination multiple lamination units, and is capable of obtaining more capacity and flexibility in circuit layout. In other words, the circuit board of the present embodiment having the advantages of the printed circuit board (the rigid circuit board) and the flexible circuit board can manufactured by a simple, fast, and low cost process.

In respect to a conventional six layered flexible-rigid composite circuit board, a fast press process is required to laminate a cover layer (e.g. PET substrate) for forming the flexible part. And, two hot press steps are required for the rigid part of the conventional six layered flexible-rigid composite circuit board to form other four circuit layers.

However, to the present embodiment, merely two lamination steps are required to form a six layered circuit board. Thus, the process of the present embodiment is fast and simple.

The circuit boards of the above embodiments and the conventional printed circuit boards are compared below.

TABLE 1

Comparison of the circuit boards of embodiments of the present application and the conventional printed circuit boards

| Number of Circuit Layer | Thickness (mm) | |
| --- | --- | --- |
| | Conventional Printed Circuit Boards | Embodiments of the Present Application |
| 4 | 0.51 | 0.21 |
| 10 | 0.71 | 0.53 |
| 6 (Flexible-Rigid Composite Circuit Board) | 0.45 | 0.31 |

Referring to the above Table 1, thicknesses of the circuit boards of embodiments of the present application are less than those of the conventional printed circuit boards. More specifically, the thickness of the four layered circuit board of the present application is 41.2% of the thickness of the conventional four layered printed circuit board. The thickness of the ten layered circuit board of the present application is 74.6% of the thickness of the conventional ten layered printed circuit board. The thickness of the six layered flexible-rigid composite circuit board of the present application is 68.9% of the thickness of the conventional six layered flexible-rigid composite circuit board.

Furthermore, instead of an FR4 substrate of the conventional printed circuit board with high dielectric constant, a polyimide layer and adhesive layers, which sustain high temperature and have a dielectric constant lower than 3, are used in the present application to obtain favorable electrical properties.

Although the present application has been described with reference to the above embodiments, it is apparent to one of the ordinary skill in the art that modifications to the described embodiments may be made without departing from the spirit of the invention. Accordingly, the scope of the present application will be defined by the attached claims not by the above detailed descriptions.

What is claimed is:

1. A circuit board, comprising:
   a core unit comprising:
      a first polyimide layer having a first surface and a second surface opposite to each other;
      a first adhesive layer disposed on the first surface;
      a second adhesive layer disposed on the second surface;
      a first conductive layer disposed on the first adhesive layer; and
      a second conductive layer disposed on the second adhesive layer; and
   a first lamination unit disposed at a first side of the core unit and comprising:
      a second polyimide layer having a third surface and a fourth surface opposite to each other;
      a third adhesive layer disposed on the third surface;
      a fourth adhesive layer disposed on the fourth surface and bonded to the first conductive layer; and
      a third conductive layer disposed on the third adhesive layer, wherein the first adhesive layer, the second adhesive layer, the third adhesive layer and the fourth adhesive layer all have a glass transition temperature between 140° C. and 160° C.

2. The circuit board as claimed in claim 1, further comprising:
   a second lamination unit disposed at a second side of the core unit and comprising:
      a third polyimide layer having a fifth surface and a sixth surface opposite to each other;
      a fifth adhesive layer disposed on the fifth surface;
      a sixth adhesive layer disposed on the sixth surface and bonded to the second conductive layer, wherein the fifth adhesive layer and the sixth adhesive layer both have a glass transition temperature between 140° C. and 160° C.; and
      a fourth conductive layer disposed on the fifth adhesive layer.

3. The circuit board as claimed in claim 2, further comprising:
   a first solder mask layer located on the third conductive layer; and
   a second solder mask layer located on the fourth conductive layer.

4. The circuit board as claimed in claim 2, further comprising:
   at least another first lamination unit located at the first side of the core unit, wherein a fourth adhesive layer of the another first lamination unit is bonded to the third conductive layer of the prior first lamination unit; and
   at least another second lamination unit located at the second side of the core unit, wherein a sixth adhesive layer of the another second lamination unit is bonded to the fourth conductive layer of the prior second lamination unit.

5. The circuit board as claimed in claim 4, further comprising:
   a first solder mask layer located on the outermost third conductive layer; and
   a second solder mask layer located on the outermost fourth conductive layer.

6. The circuit board as claimed in claim 2, wherein a dielectric constant of the fifth adhesive layer and the sixth adhesive layer is less than 3.

7. The circuit board as claimed in claim 1, wherein a dielectric constant of the first adhesive layer, the second adhesive layer, the third adhesive layer and the fourth adhesive layer is less than 3.

8. A circuit board, comprising:
a first core unit comprising:
  a first polyimide layer having a first surface and a second surface opposite to each other;
  a first adhesive layer disposed on the first surface;
  a second adhesive layer disposed on the second surface;
  a first conductive layer disposed on the first adhesive layer; and
  a second conductive layer disposed on the second adhesive layer;
a second core unit disposed at a first side of the first core unit and comprising:
  a second polyimide layer having a third surface and a fourth surface opposite to each other;
  a third adhesive layer disposed on the third surface;
  a fourth adhesive layer disposed on the fourth surface;
  a third conductive layer disposed on the third adhesive layer; and
  a fourth conductive layer disposed on the fourth adhesive layer and facing the first conductive layer;
a third core unit disposed at a second side of the first core unit and comprising:
  a third polyimide layer having a fifth surface and a sixth surface opposite to each other;
  a fifth adhesive layer disposed on the fifth surface;
  a sixth adhesive layer disposed on the sixth surface;
  a fifth conductive layer disposed on the fifth adhesive layer; and
  a sixth conductive layer disposed on the sixth adhesive layer and facing the second conductive layer;
a seventh adhesive layer, wherein the fourth conductive layer is bonded to the first conductive layer through the seventh adhesive layer;
an eighth adhesive layer, wherein the sixth conductive layer is bonded to the second conductive layer through the eighth adhesive layer;
a first lamination unit disposed at the first side of the first core unit and comprising:
  a fourth polyimide layer having a seventh surface and an eighth surface opposite to each other;
  a ninth adhesive layer disposed on the seventh surface;
  a tenth adhesive layer disposed on the eighth surface and bonded to the third conductive layer; and
  a seventh conductive layer disposed on the ninth adhesive layer; and
a second lamination unit disposed at the second side of the first core unit and comprising:
  a fifth polyimide layer having a ninth surface and a tenth surface opposite to each other;
  an eleventh adhesive layer disposed on the ninth surface;
  a twelfth adhesive layer disposed on the tenth surface and bonded to the fifth conductive layer; and
  an eighth conductive layer disposed on the eleventh adhesive layer, wherein the first adhesive layer, the second adhesive layer, the third adhesive layer, the fourth adhesive layer, the fifth adhesive layer, the sixth adhesive layer, the seventh adhesive layer, the eighth adhesive layer, the ninth adhesive layer, the tenth adhesive layer, the eleventh adhesive layer and the twelfth adhesive layer all have a glass transition temperature between 140° C. and 160° C.

9. The circuit board as claimed in claim 8, further comprising:
  a first solder mask layer located on the seventh conductive layer; and
  a second solder mask layer located on the eighth conductive layer.

10. The circuit board as claimed in claim 8, wherein the circuit board has a first region, and a part of the first lamination unit in the first region is removed, such that the first lamination unit and the third conductive layer together expose a part of the third adhesive layer in the first region.

11. The circuit board as claimed in claim 10, wherein a part of the second lamination unit in the first region is removed, such that the second lamination unit and the fifth conductive layer together expose a part of the fifth adhesive layer in the first region, and a thickness of the circuit board in the first region is less than a thickness of the circuit board in other regions.

12. The circuit board as claimed in claim 11, wherein a part of the seventh adhesive layer located in the first region and corresponding to a plurality of conductive terminals of the first conductive layer is removed, and a part of the second core unit in the first region is remove to expose the conductive terminals.

13. The circuit board as claimed in claim 8, wherein a dielectric constant of the first adhesive layer, the second adhesive layer, the third adhesive layer, the fourth adhesive layer, the fifth adhesive layer, the sixth adhesive layer, the seventh adhesive layer, the eighth adhesive layer, the ninth adhesive layer, the tenth adhesive layer, the eleventh adhesive layer and the twelfth adhesive layer is less than 3.

14. A circuit board process, comprising:
providing a core unit comprising:
  a first polyimide layer having a first surface and a second surface opposite to each other;
  a first adhesive layer disposed on the first surface;
  a second adhesive layer disposed on the second surface;
  a first conductive layer disposed on the first adhesive layer; and
  a second conductive layer disposed on the second adhesive layer;
providing a first lamination unit comprising:
a second polyimide layer having a third surface and a fourth surface opposite to each other;
  a third adhesive layer disposed on the third surface;
  a fourth adhesive layer disposed on the fourth surface and facing the first conductive layer; and
  a third conductive layer disposed on the third adhesive layer; and
performing a first lamination step with a temperature higher than 160° C. to laminate the first lamination unit and the core unit and to bond the fourth adhesive layer of the first lamination unit to the first conductive layer.

15. The circuit board process as claimed in claim 14, wherein before the first lamination step, the circuit board process further comprises:
providing a second lamination unit comprising:
  a third polyimide layer having a fifth surface and a sixth surface opposite to each other;
  fifth adhesive layer disposed on the fifth surface;
  a sixth adhesive layer disposed on the sixth surface and facing the second conductive layer; and
  a fourth conductive layer disposed on the fifth adhesive layer, wherein
in the first lamination step, the first lamination unit, the core unit and the second lamination unit are laminated together, the fourth adhesive layer is bonded to the first conductive layer, and the sixth adhesive layer is bonded to the second conductive layer.

16. The circuit board process as claimed in claim 15, wherein after the first lamination step, the circuit board process further comprises:

forming a first solder mask layer on the third conductive layer; and forming a second solder mask layer on the fourth conductive layer.

17. The circuit board process as claimed in claim 15, wherein after the first lamination step, the circuit board process further comprises:

providing another first lamination unit, wherein a fourth adhesive layer of the another first lamination unit is exposed and faces the third conductive layer of the prior first lamination unit;

providing another second lamination unit, wherein a sixth adhesive layer of the another second lamination unit is exposed and faces the fourth conductive layer of the prior second lamination unit; and performing a second lamination step with a temperature higher than 160° C. to laminate all the first lamination units, the second lamination units and the core unit, wherein the fourth adhesive layer of the another first lamination unit is bonded to the third conductive layer of the prior first lamination unit, and the sixth adhesive layer of the another second lamination unit is bonded to the fourth conductive layer of the prior second lamination unit.

18. The circuit board process as claimed in claim 17, wherein after the second lamination step, the circuit board process further comprises:

forming a first solder mask layer on the outermost third conductive layer; and forming a second solder mask layer on the outermost fourth conductive layer.

19. The circuit board process as claimed in claim 17, wherein the second lamination step is conducted with the temperature between 160° C. and 200° C.

20. The circuit board process as claimed in claim 1, wherein the first lamination step is conducted with the temperature between 160° C. and 200° C.

\* \* \* \* \*